United States Patent
Song et al.

(10) Patent No.: US 11,845,819 B2
(45) Date of Patent: Dec. 19, 2023

(54) CURABLE COMPOSITION, MANUFACTURING METHOD THEREOF AND DISPLAY DEVICE

(71) Applicant: LG Display Co., Ltd., Seoul (KR)

(72) Inventors: JaeBin Song, Seoul (KR); SungHee Kim, Daejeon (KR); SuYeon Lee, Seoul (KR); Moon-Gun Choi, Seoul (KR); Younghun Kim, Seoul (KR); Yeon Jeong Lee, Seoul (KR); Minji Jeong, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 467 days.

(21) Appl. No.: 17/039,835

(22) Filed: Sep. 30, 2020

(65) Prior Publication Data
US 2021/0102013 A1 Apr. 8, 2021

(30) Foreign Application Priority Data
Oct. 2, 2019 (KR) .................. 10-2019-0122671

(51) Int. Cl.
| | |
|---|---|
| *C08F 22/10* | (2006.01) |
| *C07F 7/00* | (2006.01) |
| *H10K 50/84* | (2023.01) |
| *B01J 20/22* | (2006.01) |
| *C08F 20/10* | (2006.01) |
| *H10K 50/842* | (2023.01) |
| *C09D 4/00* | (2006.01) |

(52) U.S. Cl.
CPC ............ *C08F 22/10* (2013.01); *B01J 20/223* (2013.01); *C07F 7/003* (2013.01); *C08F 20/10* (2013.01); *C09D 4/00* (2013.01); *H10K 50/84* (2023.02); *H10K 50/846* (2023.02); *H10K 50/8426* (2023.02)

(58) Field of Classification Search
None
See application file for complete search history.

(56) References Cited

U.S. PATENT DOCUMENTS

| | | | |
|---|---|---|---|
| 10,882,870 B2 * | 1/2021 | Corella Ochoa | ....... C07F 1/005 |
| 2015/0238930 A1 | 8/2015 | Said et al. | |
| 2016/0064772 A1 | 3/2016 | Choi et al. | |
| 2017/0136128 A1 | 5/2017 | Hartlieb et al. | |

(Continued)

FOREIGN PATENT DOCUMENTS

| | | |
|---|---|---|
| CN | 108654402 A | 10/2018 |
| WO | 2008062034 A1 | 5/2008 |

(Continued)

OTHER PUBLICATIONS

Waitschat, "Synthesis of M—UiO-66 (M=Zr, Ce or Hf) employing 2,5-pyridinedicarboxylic acid as a linker: defect chemistry, framework hydrophilization and sorption properties", Dalton Trans. 2018, 47, 1062-1070 (Year: 2018).*

(Continued)

*Primary Examiner* — Nicole M. Buie-Hatcher
(74) *Attorney, Agent, or Firm* — POLSINELLI PC

(57) ABSTRACT

A curable composition includes a hygroscopic salt comprising a metal-organic framework comprising a cluster comprising zirconium and a positively charged organic ligand and an anion, to an encapsulation part having excellent anti-moisture and optical properties.

8 Claims, 8 Drawing Sheets

(56) References Cited

U.S. PATENT DOCUMENTS

2017/0182453 A1* 6/2017 Mu .................. B01J 20/226
2017/0327608 A1* 11/2017 Mieda ................ C07F 5/069
2020/0030737 A1* 1/2020 Zaworotko ......... B01J 20/223

FOREIGN PATENT DOCUMENTS

WO     2009092777 A1    7/2009
WO     2011002183 A2    1/2011

OTHER PUBLICATIONS

Wang, "The water-based synthesis of chemically stable Zr-based MOFs using pyridine-containing ligands and their exceptionally high adsorption capacity for iodine", Dalton. Trans., 2017, 46, 7412-7420 (Year: 2017).*

Zhu, A novel sensitive fluorescent probe of $S_2O_8^{2-}$ and $Fe^{3+}$ based on covalent post-functionalization of a zirconium (IV) metal-organic framework, Dalton Trans., 2018, 47,11586 (Year: 2018).*

Zhang "Tuning Water Sorption in Highly Stable Zr(IV)-Metal-Organic Frameworks through Local Functionalization of Metal Clusters", ACS Appl. Mater. Interfaces, 2018, 10, 27868-27874 (Year: 2018).*

Chinese Office Action and Search Report dated Jan. 3, 2023 issued in Patent Application No. 202011047076.1 w/ English Translation (16 pages).

* cited by examiner

CURABLE COMPOSITION, MANUFACTURING METHOD THEREOF AND DISPLAY DEVICE

CROSS-REFERENCE TO RELATED APPLICATION

This application claims priority from Korean Patent Application No. 10-2019-0122671, filed on Oct. 2, 2019, which is hereby incorporated by reference in its entirety.

BACKGROUND

Field of the Disclosure

The present disclosure relates to a curable composition, a manufacturing method thereof and a display device.

Description of the Background

An organic electric device is a device including one or more organic layers consisting of an organic material. The organic electric device includes organic light emitting diodes (OLEDs), organic solar cells, organic photoreceptors, or organic transistors and the like.

The organic light emitting device may be included in a display device. However, the organic layer included in the organic light emitting device may be oxidized very easily by outside materials such as moisture or oxygen. The display device may include an encapsulation part to prevent the outside materials such as the moisture or the oxygen from penetrating the organic electric element.

As a result, an excellent hygroscopicity is required in the encapsulation part for protecting the organic electric element from the outside materials such as the moisture or the oxygen. In addition, when the optical performance of the encapsulation portion is excellent, the optical efficiency of the display device may be improved, so that the encapsulation portion is also required to have excellent optical performance. In the case of an encapsulation portion applied to a transparent display, the encapsulation portion must be optically transparent while having excellent anti-moisture or moisture resistance.

SUMMARY

Accordingly, the present disclosure provides a curable composition capable of forming an encapsulation part excellent in anti-moisture and optical performance.

In addition, the present disclosure provides a manufacturing method of the curable composition.

Further, aspects may provide a display device including an encapsulation part excellent in anti-moisture and optical performance.

An aspect of the present disclosure provides a curable composition comprising a hygroscopic salt and a photocurable monomer.

The hygroscopic salt may comprise a metal-organic framework comprising a cluster comprising zirconium and a positively charged organic ligand and an anion.

Another aspect of the present disclosure provides a display device comprising a substrate, an organic electric element located on the substrate and an encapsulation part encapsulating the organic electric element.

The encapsulation part may comprise a hygroscopic salt comprising a metal-organic framework comprising a cluster comprising zirconium and a positively charged organic ligand and an anion.

Another aspect of the present disclosure provides a manufacturing method of a curable composition comprising forming a precursor salt comprising iodine anion, and exchanging the iodine anion to form a hygroscopic salt.

The forming the precursor salt may comprise reacting metal-organic framework $Zr_6O_4(OH)_5(PyDC)_4(formate)_3(H_2O)_{34}$ of UiO-66 type with iodinemethane($CH_3I$) wherein the PyDC is 2,5-pyridinedicarboxylic acid.

The exchanging the iodine anion may be reacting the precursor salt with a salt comprising at least one anion selected from the group consisting of $BF_4^-$, $PF_6^-$ and $S_2O_8^{2-}$, and exchanging the iodine anion to form the hygroscopic salt.

Yet another aspect of the present disclosure provides a curable composition including a hygroscopic salt and a manufacturing thereof capable of forming an encapsulation part having excellent anti-moisture and optical performance.

A further aspect of the present disclosure provides an encapsulation part including a hygroscopic salt capable of forming a display device having excellent anti-moisture and optical performance.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION

Figure 1:
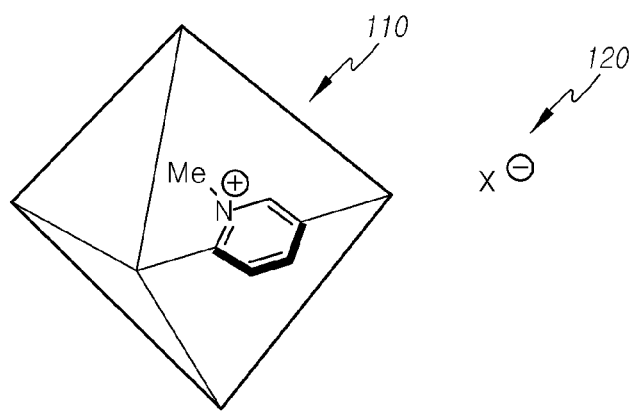
FIG. 1 is a view schematically showing a hygroscopic salt according to the present disclosure.

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

A curable composition according to aspects comprises a hygroscopic salt and a photocurable monomer. The hygroscopic salt may be a substance having hygroscopicity and including cations and anions.

FIG. 1 is a view schematically showing a hygroscopic salt according to aspects.

Referring to FIG. 1, The hygroscopic salt 100 includes a positively charged metal-organic framework 110 and an anion 120.

The metal-organic frameworks 110 may refer to a compound in which a metal ion or a cluster coordinates with an organic ligand to form a one-dimensional, two-dimensional or three-dimensional conformation.

The metal-organic frameworks 110 may have a three-dimensional conformation having pores therein. Since the metal-organic framework 110 has the above-described structure, moisture can be physically adsorbed to the internal pore of the metal-organic framework 110. In this example, the hygroscopic salt 100 may have excellent hygroscopicity by including the metal-organic framework 110.

The metal-organic framework 110 may have an anion or negative ion in its internal pore. When the metal-organic framework 110 includes the anion in the internal pore, the adsorption power with the polar moisture increases and the adsorption of moisture into the internal pore of the metal-organic framework 110 is enhanced so that the hygroscopic salt 100 may have excellent hygroscopicity.

The metal-organic framework 110 may comprise a cluster comprising zirconium. Since the metal-organic framework 110 includes the cluster comprising zirconium, the hygroscopic salt 100 may have excellent hygroscopicity.

The metal-organic framework 110 may comprise a positively charged organic ligand or an organic ligand having a positive charge. Since the metal-organic framework 110 comprises the positively charged organic ligand, the hygroscopic salt 100 may have excellent hygroscopicity due to an increase in the adsorption power with the polar moisture.

The organic ligand may be a dicarboxylic acid comprising a heterocycle of C2-C20 comprising at least one heteroatom selected from the group consisting of N, O, S and P.

The term "heterocycle" as used herein includes an aromatic ring such as "heteroaryl" as well as a non-aromatic ring, and may refer to a ring of $C_2$-$C_{20}$ including one or more heteroatoms unless otherwise specified, but it is not limited thereto. The term "heteroatom" as used herein refers to N, O, S, P or Si unless otherwise specified, and the heterocycle means a compound including the heteroatom such as a monocyclic, a fused ring, a conjugated multi-cyclic, and a spiro compounds.

The heterocycle of the aforementioned organic ligand may be, for example, a heterocycle of $C_2$-$C_{10}$ or $C_2$-$C_6$.

The dicarboxylic acid of the above-mentioned organic ligand may mean that at least two carboxyl groups are included in one organic ligand molecule.

The positive charge of the metal-organic framework 110 may be a positive charge of one or more of the heteroatoms of the heterocycle included in the above-described organic ligand.

The organic ligand of the metal-organic framework 110 may be the dicarboxylic acid comprising a heterocycle of 6 atoms comprising at least one heteroatom selected from the group consisting of N, O, S and P. As one example, at least one of the heteroatoms comprised in the heterocycle of 6 atoms has a positive charge. The two carboxyl groups of the dicarboxylic acids are para position with respect to each other. When the metal-organic framework 110 includes the above-described organic ligand, it may have a three-dimensional structure having excellent moisture adsorption power.

For example, the organic ligand is one in which the nitrogen atom of 2,5-pyridinedicarboxylic acid is methylated and the nitrogen atom has a positive charge. Referring to FIG. 1, Me is a methyl group. As illustrated in FIG. 1, when the hygroscopic salt 100 includes an organic material in which the nitrogen atom of 2,5-pyridinedicarboxylic acid is methylated as an organic ligand, the hygroscopic salt 100 may have excellent moisture adsorption power.

The fact that the nitrogen atom is methylated may mean that the non-covalent electron pair of the nitrogen atom contained in the 2,5-pyridinedicarboxylic acid is bound to the methyl group. Therefore, the above-described nitrogen atom is positively charged by methylation.

For example, the metal-organic framework 110 may be a UiO-66 type. When the metal-organic framework 110 is the UiO-66 type, the hygroscopic salt 100 may have excellent hygroscopicity.

Referring to FIG. 1, the hygroscopic salt 100 includes the anion 120. In FIG. 1, the anion 120 is represented by X– having a monovalent negative charge, but the anion included in the hygroscopic salt 100 is not limited to an ion having a monovalent negative charge.

For a salt including the cation of the metal-organic framework and the anion, the color of the salt may be determined according to the type of the anion. For example, the anion 120 included in the hygroscopic salt 100 is at least one selected from the group consisting of $BF_4^-$, $PF_6^-$ and $S_2O_8^{2-}$. When the hygroscopic salt 100 includes the anion described above, the hygroscopic salt 100 is white in a solid state and transparent in the encapsulation part. Therefore, the curable composition including the hygroscopic salt 100 can provide an encapsulation part having excellent hygroscopicity and optical performance.

The photocurable monomer may mean a monomer that forms a polymer by initiating a polymerization reaction by irradiation of light. The photo-curable monomer may mean a monomer that may be cured with initiation reaction by free radicals or cations which are formed by irradiation with active energy rays such as ultraviolet rays and electron beams.

The photocurable monomer may be a monomer having a functional group capable of initiating a polymerization reaction by irradiation of light and being cured. The photocurable monomer may be, for example, a monomer that may be cured by ultraviolet light having a wavelength of 300 nm to 500 nm.

For example, the photocurable monomer may comprise a functional group including an ethylene-like unsaturated double bond such as acryloyl group, methacryloyl group, acryloyloxy group or methacryloyloxy group, or functional group such as epoxy group or oxetane group. In one exemplary example, the photocurable monomer may comprise a (meth) acryloyl group. The (meth) acryloyl group may be referred as one of acryloyl group, methacryloyl group and their combination.

The photocurable monomer may satisfy chemical formula 1 as follows.

[Chemical formula 1]

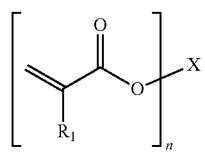

In chemical formula 1, R1 is hydrogen or an alkyl group of $C_1$-$C_4$, n is an integer of 2 or higher, and X may be a linear, branched or cyclic alkyl or alkenyl group or their combination.

For example, X may be the alkyl group of $C_3$-$C_{30}$, the alkyl group of $C_4$-$C_{28}$, the alkyl group of $C_6$-$C_{28}$, the alkyl group of $C_8$-$C_{22}$ or the alkyl group of $C_{12}$-$C_{20}$. Also, when X may be the alkenyl group of $C_3$-$C_{30}$, the alkenyl group of $C_4$-$C_{28}$, the alkenyl group of $C_6$-$C_{28}$, the alkenyl group of $C_8$-$C_{22}$ or the alkenyl group of $C_{12}$-$C_{20}$.

The above-mentioned photocurable monomer may be, for example, one or more selected from the group consisting of methyl (meth) acrylate, ethyl (meth) acrylate, butyl (meth) acrylate, trimethylolpropane tri (meth) acrylate, 2-hydroxyethyl (meth) Acrylate, 2-hydroxypropyl (meth) acrylate, pentaerythritol tri (meth) acrylate, ethylene glycol di (meth) acrylate and 2-ethylhexyl (meth) acrylate.

In the curable composition of one example, the hygroscopic salt may be included at 0.1 to 5 parts by weight, and the photocurable monomer may be included at 90 to 99.9 parts by weight. In the curable composition of the other example, the hygroscopic salt may be included at 0.1 to 3 parts by weight, and the photocurable monomer may be included at 90 to 99.9 parts by weight. In the curable composition of another example, the hygroscopic salt may be included at 0.1 to 2 parts by weight, and the photocurable monomer may be included at 90 to 99.9 parts by weight. When the curable composition includes the hygroscopic salts and the photocurable monomer in the above-described weight ratio, the curable composition provides an encapsulation part which is transparent, has a low haze, and is excellent in hygroscopicity.

In an aspect, the photocurable composition may include an initiator. The above-described initiator may be, for example, a photopolymerization initiator. As the photopolymerization initiator, for example, a cationic photopolymerization initiator can be used.

As the cationic photopolymerization initiator, an onium salt- or organometallic salt-based ionized cationic initiator, or an organic silane- or latent sulfonic acid-based non-ionized cationic photopolymerization initiator may be used. The onium salt-based initiator may be a diaryliodonium salt, a triarylsulfonium salt or an aryldiazonium salt, the organometallic salt-based initiator may be iron arene, the organic silane-based initiator may be o-nitrobenzyl triaryl silyl ether, triaryl silyl peroxide or acyl silane, and the latent sulfonic acid-based initiator may be α-sulfonyloxy ketone or α-hydroxymethylbenzoin sulfonate, but the present application is not limited.

The above-described initiator may be, for example, a radical initiator. For example, a benzoin-based, hydroxy ketone-based, amino ketone-based or phosphine oxide-based photoinitiator may be used, and specifically, benzoin, benzoin methylether, benzoin ethylether, benzoin isopropylether, benzoin n-butylether, benzoin isobutylether, acetophenone, dimethylamino acetophenone, 2,2-dimethoxy-2-phenylacetophenone, 2,2-diethoxy-2-phenylacetophenone, 2-hydroxy-2-methyl-1-phenylpropane-1-one, 1-hydroxycyclohexyl phenyl ketone, 2-methyl-1-[4-(methylthio)phenyl]-2-morpholino-propane-1-one, 4-(2-hydroxyethoxy)phenyl-2-(hydroxy-2-propyl)ketone, benzophenone, p-phenyl benzophenone, 4,4?-diethylaminobenzophenone, dichlorobenzophenone, 2-methylanthraquinone, 2-ethyl anthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyldimethylketal, acetophenone dimethylketal, p-dimethylamino benzoic acid ester, oligo [2-hydroxy-2-methyl-1-[4-(1-methylvinyl)phenyl]propanone] or 2,4,6-trimethylbenzoyl-diphenyl-phosphineoxide may be used.

A content of the initiator in the curable composition may be changed by the type and content ratio of a polymerizable functional group included in the curable composition, or a crosslinking density of the polymer formed of the curable composition. For example, the initiator may be included in the curable composition at 0.1 to 10 parts by weight with respect to 100 parts by weight of the photocurable monomers.

The manufacturing method of a curable composition according to aspects may include preparing the above-mentioned hygroscopic salt and dispersing the above-mentioned hygroscopic salt in a curable compound.

Figure 2:
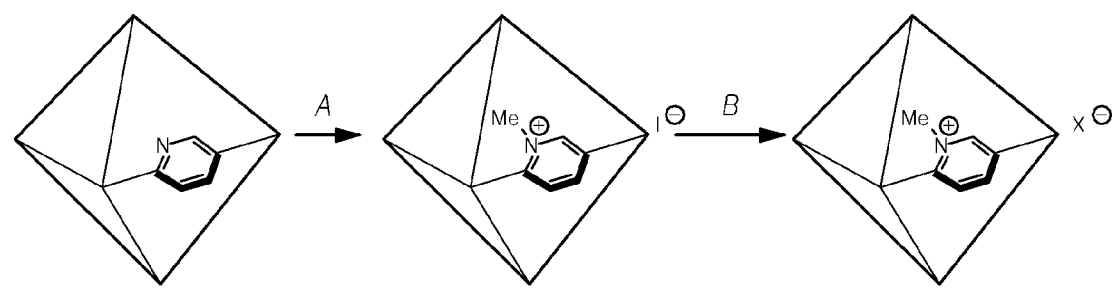
FIG. 2 is a view for showing a manufacturing method of the curable composition according to the present disclosure.

FIG. 2 is a view for showing a manufacturing method of the curable composition according to the aspects.

Referring to FIG. 2, a manufacturing method of a curable composition according to the aspects may comprise forming a precursor salt comprising iodine anion at step A, and exchanging the iodine anion to form a hygroscopic salt at step B.

The forming the precursor salt at the Step A may be reacting metal-organic framework $Zr_6O_4(OH)_5(PyDC)_4(formate)_3(H_2O)_{34}$ of UiO-66 type with iodinemethane ($CH_3I$) wherein the PyDC is 2,5-pyridinedicarboxylic acid.

The metal-organic framework $Zr_6O_4(OH)_5(PyDC)_4(formate)_3(H_2O)_{34}$ of the UiO-66 type, may include 2,5-pyridinedicarboxylic acid as an organic ligand. Therefore, The metal-organic framework $Zr_6O_4(OH)_5(PyDC)_4(formate)_3(H_2O)_{34}$ of the UiO-66 type may be represented as UiO-66-Py.

The precursor salt formed by the Step A may include a positively charged metal-organic framework in which the nitrogen atom of the dicarboxylic acid organic ligand in the metal-organic framework $Zr_6O_4(OH)_5(PyDC)_4(formate)_3(H_2O)_{34}$, of the aforementioned UiO-66 type may be methylated by a methyl group of iodine methane and an iodine anion (I−).

The precursor salt formed by the step A may have a yellow or orange color in a solid state. Therefore, when the precursor salt formed by the step A is included in the encapsulation part of the display device, transparency and haze of the encapsulation part may be reduced.

When using iodinemethane ($CH_3I$) in the above-mentioned step A, it is easy to handle and has no explosiveness due to a solid state at room temperature so that it can easily form the precursor salt.

In addition, when using iodine methane ($CH_3I$) in the step A, the methyl group is easily removed by the iodine atom bonded to the methyl group so that methylation of the organic ligand of the UiO-66-Py Migration can easily occur.

The exchanging the iodine anion at the Step B may be reacting the precursor salt with a salt comprising at least one anion selected from the group consisting of $BF_4^-$, $PF_6^-$ and $S_2O_8^{2-}$, and exchanging the iodine anion to form the hygroscopic salt. When the iodine anion is exchanged for the anion described above, the formed hygroscopic salt is white (colorless) in a solid state, and is transparent in the dispersed state in the curable composition. So even if included in the encapsulation part, the encapsulation part can have an excellent transparency and a low haze value.

The salt comprising at least one anion selected from the group consisting of $BF_4^-$, $PF_6^-$ and $S_2O_8^{2-}$ may comprise at least one cation of $NH^{4+}$ and $Na^+$. When the iodine anion of the precursor salt is exchanged using the aforementioned salt, the formed hygroscopic salt is white (colorless) in a solid state, and is transparent in the dispersed state in the curable composition. So even if included in the encapsulation part, the encapsulation part can have excellent transparency and a low haze value.

The salt used in the step B may be, for example, one or more selected from the group consisting of $(NH_4)BF_4$, $NaBF_4$, $(NH_4)PF_6^-$ and $(NH_4)_2S_2O_8$.

The manufacturing method of the curable composition according to aspects may further include dispersing the aforementioned hygroscopic salt in the curable compound.

The method for dispersing the above-mentioned hygroscopic salt in the curable compound is not particularly limited, and a known dispersing method can be used.

The aforementioned curable compound may include, for example, the photocurable monomer. The description to the photocurable monomer will be omitted because it is the same as the description for the photocurable monomer of the curable compound according to the above-described aspects unless otherwise described. The other aspects may provide a display device including the above mentioned the curable composition.

Figure 3:
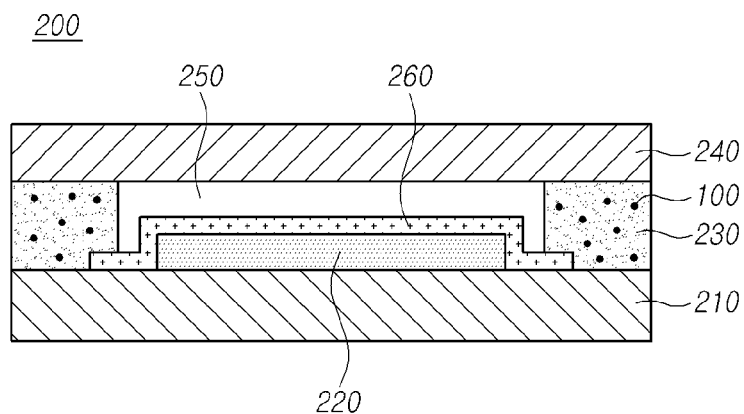
FIG. 3 is a cross-sectional view for explaining an encapsulation part of the display device according to the present disclosure.

FIG. 3 is a cross-sectional view of a display device according to the aspects.

Referring to FIG. 3, the display device 200 according to the aspects includes a substrate 210, an organic electric element 220 and an encapsulation part 230, 250 and 260.

The type of the substrate 210 is not particularly limited as long as the organic electric element 220 and the thin film transistor for driving the organic electric element 220 can be formed thereon. For example, the substrate 210 may be a plastic substrate or a glass substrate. In addition, the thin film transistor driving the organic electrical element 220 may be positioned on one surface of the substrate 210.

The organic electric element 220 may be located on the substrate 210. For example, the organic electric element 220 may be located on the thin film transistor (not shown) on one surface of the substrate 210.

The organic electric element 220 may be, for example, an organic light emitting diode (OLED). The organic light emitting diode may include a first electrode, an organic layer, and a second electrode sequentially stacked. For example, the first electrode may be an anode electrode, and the second electrode may be a cathode electrode.

The organic electric element 220 may be located in an active area (A/A) of the display device to transmit visual information. A non-active area (N/A) may be located in the peripheral portion of the display device. Electric lines for driving the organic electrical element 220 may be located in the non-active area.

The encapsulation part 230, 240 and 250 may comprise the above mentioned hygroscopic salt. The hygroscopic salt of the display device 200 according to the aspects is substantially the same as the matters regarding the hygroscopic salt contained in the curable composition according to the above-described aspects, unless otherwise described with respect to the display device according to the aspects.

The aforementioned hygroscopic salt 100 may be included in, for example, a dam 230 that is one of the encapsulation part of the display device. The dam 230 surrounds a side surface of the organic electric element 220. Since the organic electric element 220 emits light so that the display device 200 may transmit the visual information, it can be located in the active area (A/A) of the display device. The dam 230 may be positioned on the peripheral portion of the substrate 210 to surround the organic electric element 220 in the central portion of the substrate 210. Therefore, the dam 230 may prevent the outside material such as oxygen or moisture from entering the organic electric element 220 positioned at the center of the substrate 210 from the outside of the display device 200.

The above-described display device 200 may further include an encapsulation substrate 240 facing the substrate 210. An encapsulation layer for encapsulating the organic electric element 220 may be located on one surface of the encapsulation substrate 240. The encapsulation part may comprise the above mentioned hygroscopic salt 100. In addition, a color filter (not shown) is located on one surface of the encapsulation substrate 240 to convert the wavelength of light emitted from the organic electric device 220.

The type of the encapsulation substrate 240 is not particularly limited, and for example, a plastic substrate, a glass substrate, or a metal thin film substrate may be used.

The aforementioned hygroscopic salt 100 may be included in, for example, the interlayer insulating film 260 that is one of the encapsulation parts of the display device 200. The interlayer insulating film 260 may be may be positioned to cover the upper and side portions of the organic electric element 220. Since interlayer insulating layer 260 is positioned to cover the upper and side portions of the organic electrical element 220, the moisture and the oxygen penetrating the organic electrical element 220 can be effectively prevented.

The aforementioned hygroscopic salt 100 may be included in, for example, a fill 250 that is one of the encapsulation portions of the display device. The fill 250 may fill a gap between the organic electric element 220 and the encapsulation substrate 240. When the hygroscopic salt 100 is included in the fill 250, the fill 250 may have excellent hygroscopicity and excellent optical performance.

The encapsulation part 230, 250 and 260 may further include the (meth) acrylate resin, and the metal-organic framework may be dispersed in the (meth) acrylate resin.

The aforementioned (meth) acrylate resin may be a photo-cured product of the aforementioned photocurable monomer.

Since the encapsulation portions 230, 250, and 260 include the hygroscopic salt 100 described above, the encapsulation part 230, 250, and 260 may have excellent optical properties. The encapsulation part 230 may have a haze of 10% or less when evaluated according to ASTM D1003 using a Haze Meter HM-150. The upper limit of the aforementioned haze range may be, for example, 9% or less, 7% or less, or 6% or less. The lower limit of the haze range described above is not particularly limited since the lower the haze value is, the better the optical properties are, but may be, for example, 0.1% or more, 0.2% or more, or 0.3% or more.

Since the encapsulation portions 230, 250, and 260 include the hygroscopic salt 100 described above, the encapsulation part 230, 250, and 260 may have excellent transmittance. The encapsulation part 230, 250, and 260, for example, may have a transmittance of 85% or more for light having a wavelength of 450 nm. The lower limit of the aforementioned transmittance range may be, for example, 87% or more or 88% or more. The upper limit of the above-described transmittance range is not particularly limited because the higher the transmittance value is, the better the optical properties, but may be, for example, 99.9% or less or 99% or less.

Hereinafter, the photocurable composition 100, the manufacturing method thereof and the display device 200 according to the aspects will be described in more detail by the following examples, but the scope of the present disclosure is not limited thereof.

Step 1. Preparation of UiO-66-Py Metal-Organic Framework

After dispersing 233 mg (1 mmol) of ZrCl$_4$ and 168 mg (1 mmol) of 2,5-pyridine dicarboxylic acid in 6 ml of distilled water in a 20 ml vial, 4 ml of acetic acid is added. After that, sonication is performed for 10 seconds, and then it is placed in an oven at 100° C. for 24 hours. Thereafter, the solid is separated from the solution using a centrifuge, and washed with 10 ml of clean ethanol. After repeating this process 3 times, it is dried in the oven. The prepared UiO-66-py is white (colorless) powder.

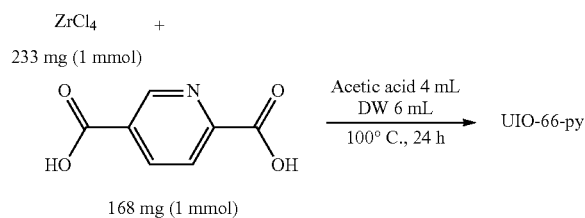

Step 2. Preparation of Precursor Salt Through Methylation of UiO-66-Py

After mixing 750 mg of the UiO-66-Py prepared in the Step 1 with 20 mL of Acetonitrile in a 70 mL vial, 2 mL of MeI is added. Because the MeI is poisonous, it must be done in the hood. After that, sonication is performed for 10 seconds, and then the vial is added to the bomb. The bomb is placed in an oven at 80° C. for 2 hours. Then, it is get out the bomb and cooled in the hood. After separating the solution and solid of the product using a centrifuge, the supernatant is neutralized with an aqueous NaOH solution. The solid is soaked overnight in a 40° C. oil bath. The prepared precursor salt (UiO-66-Py+MeI) is an orange powder.

Step 3. Preparation of Hygroscopic Salts Through Anion Exchange

In a 20 ml vial, 150 mg of the precursor salt prepared in the Step 2 and 150 mg of the reagents (six reagents listed in Table 1 below) are dispersed in 10 ml of (excess) ethanol/distilled water.

It is stirred overnight in a 60° C. oil bath. Thereafter, the solution and the solid are separated using a centrifuge, and the solid portion is dried in an oven.

TABLE 1

|  | Comparative manufacturing example 1 | Comparative manufacturing example 2 | Manufacturing example 1 | Manufacturing example 2 | Manufacturing example 3 | Manufacturing example 4 |
| --- | --- | --- | --- | --- | --- | --- |
| Reagent | AgPF$_6$ | (NH$_4$)Cl + AgSbF$_6$ | (NH$_4$)BF$_4$ | (NH$_4$)PF$_6$ | (NH$_4$)S$_2$O$_8$ | NaBF$_4$ |
| Color | black | orange | white (colorless) | white (colorless) | white (colorless) | white (colorless) |

Referring to the Table 1, the hygroscopic salt prepared according to the aspects is white (colorless). Therefore, according to the manufacturing examples of the aspects, the curable composition is capable of manufacturing an encapsulation part having excellent hygroscopicity and optical performance.

Experimental Example 1. Evaluation of Moisture Permeability and Optical Performance of the Encapsulation Portion Containing Hygroscopic Salt 0.05 g of the hygroscopic salt of the manufacturing example 1, 4.95 g of a (meth) acrylate monomer, and an ultraviolet curing initiator at 1% by weight were mixed, followed by stirring to prepare the curable composition (aspect 1).

0.10 g of the hygroscopic salt of the manufacturing example 1, 4.90 g of a (meth) acrylate monomer and an ultraviolet curing initiator at 1% by weight were mixed, followed by stirring to prepare the curable composition (aspect 2).

0.25 g of the hygroscopic salt of the manufacturing example 1, 4.75 g of a (meth) acrylate monomer and an ultraviolet curing initiator at 1% by weight were mixed, followed by stirring to prepare the curable composition (aspect 3).

0.05 g of the hygroscopic salt of the manufacturing example 2, 4.95 g of a (meth) acrylate monomer, and an ultraviolet curing initiator at 1% by weight were mixed, followed by stirring to prepare the curable composition (aspect 4).

0.10 g of the hygroscopic salt of the manufacturing example 2, 4.90 g of a (meth) acrylate monomer, and an ultraviolet curing initiator at 1% by weight were mixed, followed by stirring to prepare the curable composition (aspect 5).

0.25 g of the hygroscopic salt of the manufacturing example 2, 4.75 g of a (meth) acrylate monomer and an ultraviolet curing initiator at 1% by weight were mixed, followed by stirring to prepare the curable composition (aspect 6).

0.05 g of the hygroscopic salt of the manufacturing example 3, 4.95 g of a (meth) acrylate monomer, and an ultraviolet curing initiator at 1% by weight were mixed, followed by stirring to prepare the curable composition (aspect 7).

0.10 g of the hygroscopic salt of the manufacturing example 3, 4.90 g of a (meth) acrylate monomer, and an ultraviolet curing initiator at 1% by weight were mixed, followed by stirring to prepare the curable composition (aspect 8).

0.25 g of the hygroscopic salt of the manufacturing example 3, 4.75 g of a (meth) acrylate monomer and an ultraviolet curing initiator at 1% by weight were mixed, followed by stirring to prepare the curable composition (aspect 9).

0.05 g of the hygroscopic salt of the manufacturing example 4, 4.95 g of a (meth) acrylate monomer, and an ultraviolet curing initiator at 1% by weight were mixed, followed by stirring to prepare the curable composition (aspect 10).

0.10 g of the hygroscopic salt of the manufacturing example 4, 4.90 g of a (meth) acrylate monomer, and an ultraviolet curing initiator at 1% by weight were mixed, followed by stirring to prepare the curable composition (aspect 11).

0.25 g of the hygroscopic salt of the manufacturing example 4, 4.75 g of a (meth) acrylate monomer and an ultraviolet curing initiator at 1% by weight were mixed, followed by stirring to prepare the curable composition (aspect 12).

5.00 g of a (meth) acrylate monomer and a curing initiator at 1% by weight were mixed, followed by stirring to prepare the curable composition (comparative example 1).

0.10 g of the UiO-66-Py metal-organic framework prepared in Step 1, 4.90 g of (meth) acrylate monomer and an ultraviolet curing initiator at 1% by weight were mixed, followed by stirring to prepare a curable composition (comparative example 2).

0.10 g of the UiO-66-Py metal-organic framework prepared in Step 2, 4.75 g of (meth) acrylate monomer and an ultraviolet curing initiator at 1% by weight were mixed, followed by stirring to prepare a curable composition (comparative example 3).

Figure 4:
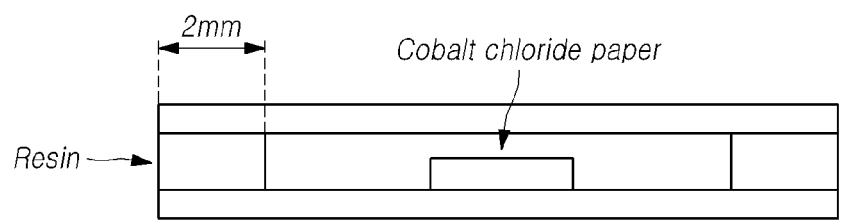
FIG. 4 is a cross-sectional view of a sample prepared to measure the anti-moisture of the encapsulation part manufactured with the curable composition of an aspect of the present disclosure and a comparative example.
Figure 5:
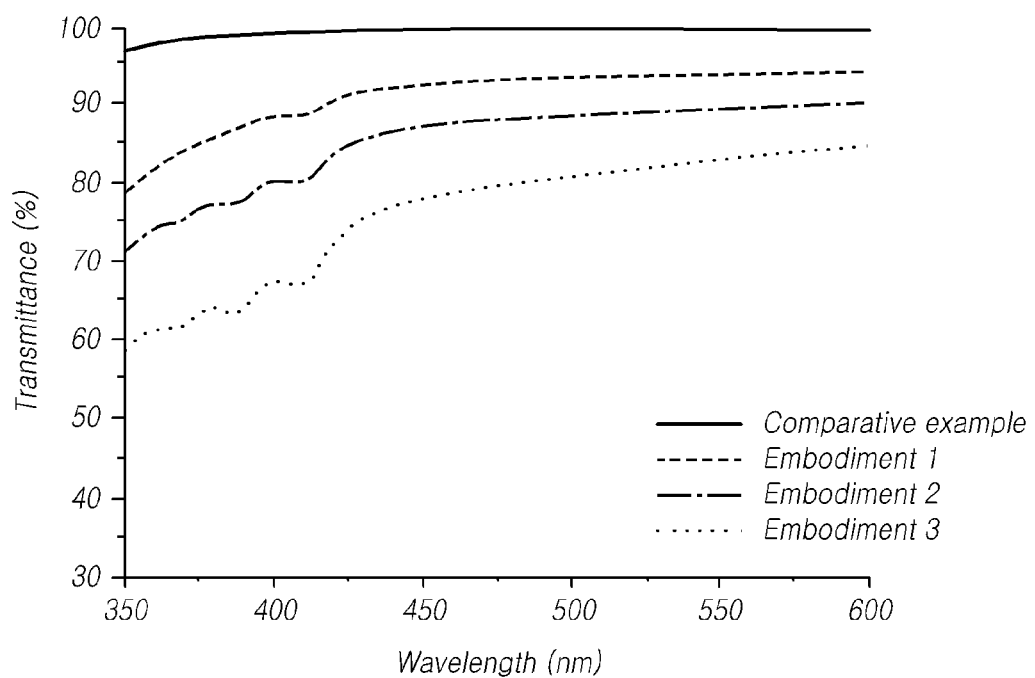
FIGS. 5 to 8 are data measuring the optical properties of the encapsulation part manufactured with a curable composition according to the present disclosure and the comparative example.

FIG. 4 is a cross-sectional view of a sample prepared to measure the anti-moisture of the encapsulation part manufactured with the curable composition of an aspect and a comparative example.

As shown in FIG. 4, cobalt chloride paper was placed in the center of 1 cm×1 cm of a glass substrate, and a curable composition prepared in the embodiments and comparative examples was coated on a 2 mm portion of the edge of the glass substrate using a bar-coating. Thereafter, the coated curable composition was cured with a UV lamp (70 mJ/cm$^2$, 20 s). After curing, the sample was placed in a thermo-hygrostat having a temperature of 85° C. and a relative humidity of 85% to measure the time taken for the color of the cobalt chloride paper to change, and the results are shown in table 2 below.

TABLE 2

| | Embodiment 2 | Embodiment 5 | Embodiment 8 | Embodiment 11 | Comparative example 2 | Comparative example 3 |
|---|---|---|---|---|---|---|
| Hygroscopic ingredients | Hygroscopic salt of manufacturing example 1 | Hygroscopic salt of manufacturing example 2 | Hygroscopic salt of manufacturing example 3 | Hygroscopic salt of manufacturing example 4 | UiO-66-Py | Precursor salt |
| Time for moisture penetration (hr) | 160 | 190 | 240 | 160 | 96 | 160 |

Referring to the Table 2, when forming the encapsulation portion with a curable composition comprising a hygroscopic salt according to the aspects, it can be seen that anti-moisture is superior to the comparative example 2. In the case of the manufacturing example 2, the anti-moisture was measured similarly to the comparative example 3, but as described below, the encapsulation part of the manufacturing example 2 is more transparent than that of the comparative example 3.

FIGS. 5 to 8 are data measuring the optical properties of the encapsulation part manufactured with a curable composition according to the aspect and the comparative example.

Figure 6:
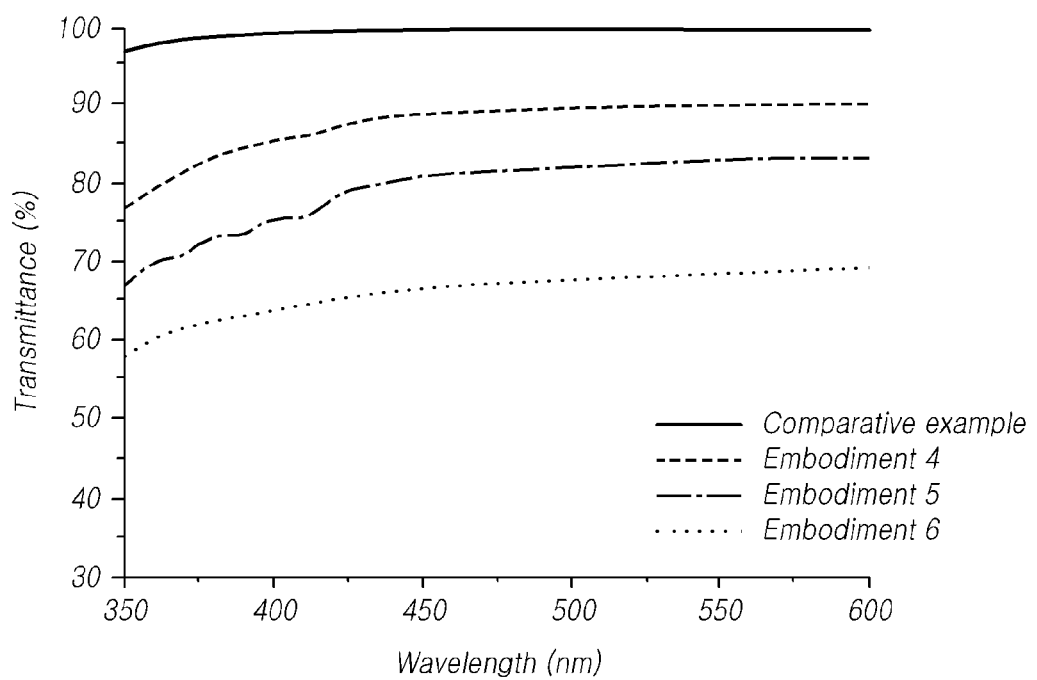
Figure 7:
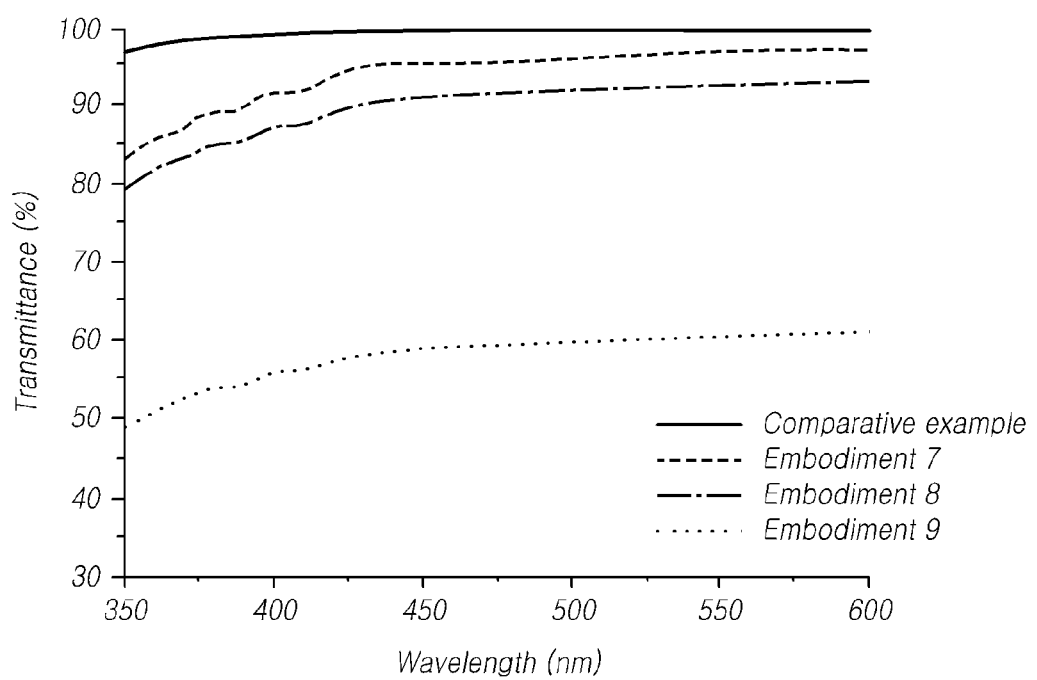
Figure 8:
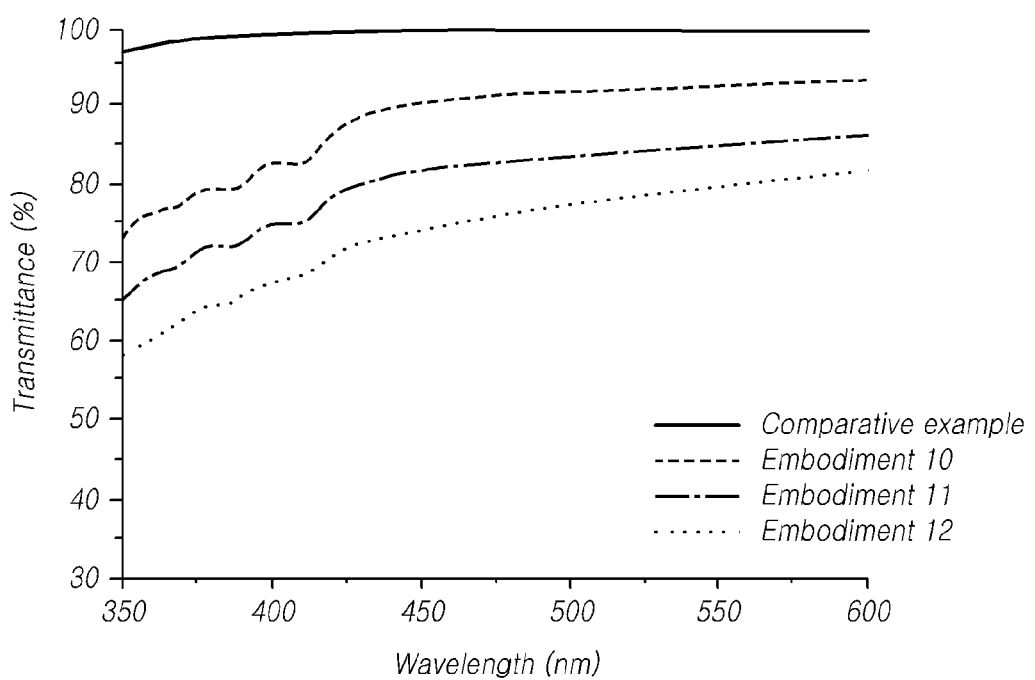

Referring to FIGS. 6 to 8, it can be seen that the embodiments 1 to 12 maintain comparatively excellent Transmittance. It can be seen that the curable compositions of embodiments 1 to 12 can form an excellent encapsulation part having both optical performance and anti-moisture since the embodiments 1 to 12 including the hygroscopic salt have excellent anti-moisture comparted with the comparative example 1.

Table 3 summarizes the results of measuring the optical properties of the encapsulation part using the curable compositions of the embodiments and the comparative examples.

TABLE 3

| | Embodiment 2 | Embodiment 5 | Embodiment 8 | Embodiment 11 | Comparative example 2 | Comparative example 3 |
|---|---|---|---|---|---|---|
| Hygroscopic ingredients | Hygroscopic salt of manufacturing example 1 | Hygroscopic salt of manufacturing example 2 | Hygroscopic salt of manufacturing example 3 | Hygroscopic salt of manufacturing example 4 | UiO-66-Py | Precursor salt |
| Transmittance (%) | 87 | 81 | 90 | 82 | 80 | 65 |
| Haze (%) | 7.4 | 7.5 | 5.3 | 7.5 | 8.2 | 8.6 |

Referring to the Table 3, it can be seen that the encapsulation part having excellent transmittance and haze properties can be formed according to an aspect. In particular, the comparative example 3 had relatively excellent anti-moisture in the Table 2, but in the Table 3, the comparative example 3 included the precursor salt having an orange color in a solid state has the very poor transmittance properties.

Therefore, it is possible to prepare the curable composition capable of forming an encapsulation part having both excellent anti-moisture and optical performance according to the aspects.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device comprising:
    a substrate;
    an organic electric element located on the substrate; and
    an encapsulation part comprising a hygroscopic salt comprising a metal-organic framework comprising a cluster comprising zirconium and a positively charged organic ligand and an anion, and encapsulating the organic electric element;
    wherein the metal-organic framework is a UiO-66; and
    wherein the positively charged organic ligand includes methylated nitrogen atom of 2,5-pyridinedicarboxylic acid, and
    wherein the methylated nitrogen atom has a positive charge.

2. The display device according to claim 1, wherein the encapsulation part further comprises a (meth) acrylate resin, and
    wherein the metal-organic framework is dispersed in the (meth) acrylate resin.

3. The display device according to claim 2, wherein the encapsulation part has a haze of 10% or less.

4. The display device according to claim 2, wherein the encapsulation part has a transmittance of 85% or more for light with a wavelength of 450 nm.

5. The display device according to claim 1, wherein the organic ligand is a dicarboxylic acid comprising a heterocycle of $C_2$-$C_{20}$ comprising at least one heteroatom selected from the group consisting of N, O, S and P, and
    at least one of the heteroatoms comprised in the heterocycle of $C_2$-$C_{20}$ has a positive charge.

6. The display device according to claim 1, wherein the positively charged organic ligand is a dicarboxylic acid comprising a heterocycle of 6 atoms comprising at least one heteroatom selected from the group consisting of N, O, S and P,
    wherein the at least one heteroatom has a positive charge, and
    wherein the two carboxyl groups of the dicarboxylic acids are in a para position with respect to each other.

7. The display device according to claim 1, wherein the anion is consisting of $BF_4^-$, $PF_6^-$ or $S_2O_8^{2-}$.

8. The display device according to claim 1, wherein the hygroscopic salt is included 0.1 to 5 parts by weight.

* * * * *